(12) United States Patent
Bryant et al.

(10) Patent No.: US 6,863,195 B2
(45) Date of Patent: Mar. 8, 2005

(54) VALVE STEM FOR USE IN A METERING VALVE OF A METERED DOSE INHALER

(75) Inventors: Andrew M. Bryant, Quorn (GB); Gustavo H. Castro, Cottage Grove, MN (US); David J. Greenleaf, Loughborough (GB); Peter D. Hodson, Breaston (GB); Gary D. Mahon, Wilford (GB)

(73) Assignee: 3M Innovative Properties Company, St. Paul, MN (US)

( * ) Notice: Subject to any disclaimer, the term of this patent is extended or adjusted under 35 U.S.C. 154(b) by 31 days.

(21) Appl. No.: 10/334,375

(22) Filed: Dec. 30, 2002

(65) Prior Publication Data

US 2003/0127464 A1 Jul. 10, 2003

Related U.S. Application Data

(60) Provisional application No. 60/345,411, filed on Dec. 31, 2001.

(51) Int. Cl.[7] .............................................. B65D 83/00
(52) U.S. Cl. .............................. 222/402.2; 222/402.24; 222/402.25
(58) Field of Search .............................. 222/162, 402.2, 222/402.24, 402.25

(56) References Cited

U.S. PATENT DOCUMENTS

| | | | |
|---|---|---|---|
| 2,980,301 A | 4/1961 | De Gorter | 222/394 |
| 3,117,700 A | 1/1964 | Gorman | |
| 3,179,306 A | 4/1965 | Corsette | |
| 3,586,216 A | 6/1971 | Jordan | |
| 3,596,808 A | 8/1971 | Corsette | |
| 3,982,674 A * | 9/1976 | Mildern | 222/402.21 |
| 4,413,755 A | 11/1983 | Brunet | |
| 4,506,803 A * | 3/1985 | Franklin et al. | 222/1 |
| 4,842,168 A | 6/1989 | Bougamont et al. | |
| 5,645,192 A | 7/1997 | Amidzich | |
| 5,772,085 A | 6/1998 | Bryant et al. | |
| 5,938,085 A | 8/1999 | Conroy et al. | |
| 6,092,698 A | 7/2000 | Bayer | |

FOREIGN PATENT DOCUMENTS

| | | | |
|---|---|---|---|
| EP | 0367604 | 5/1990 | |
| GB | 1 205 720 | 9/1970 | ............. F04F/1/06 |
| GB | 1460000 | 12/1976 | |
| GB | 2178398 A | 2/1987 | |
| GB | 2298187 A | 8/1996 | |
| GB | 2312418 A | 10/1997 | |
| GB | 2322847 A | 9/1998 | |
| WO | WO 95/03984 | 2/1995 | |
| WO | WO 98/35888 A1 | 8/1998 | |
| WO | WO 99/55600 | 11/1999 | ........... B65D/83/14 |
| WO | WO 00/26116 A1 | 5/2000 | |
| WO | WO 00/56632 A2 | 9/2000 | |
| WO | WO 01/10741 A1 | 2/2001 | |
| WO | WO 01/19701 A1 | 3/2001 | |

OTHER PUBLICATIONS

U.S. Appl. No. 60/344,990, Gasket for use in a Metering Valve that Limits Seal Intrusion, filed Dec. 31, 2001.

* cited by examiner

Primary Examiner—Joseph A. Kaufman
(74) Attorney, Agent, or Firm—Christopher D. Gram; Robert W. Sprague; Ted K. Ringsred

(57) ABSTRACT

Valve stems for use in an aerosol metering valve are described herein. The valve stems include structures designed to limit the likelihood and extent to which a gasket can intrude into an opening in the valve stem. The valve stems described herein also limit the likelihood and extent of damage to the gasket caused by repeated use of the metering valve.

11 Claims, 3 Drawing Sheets

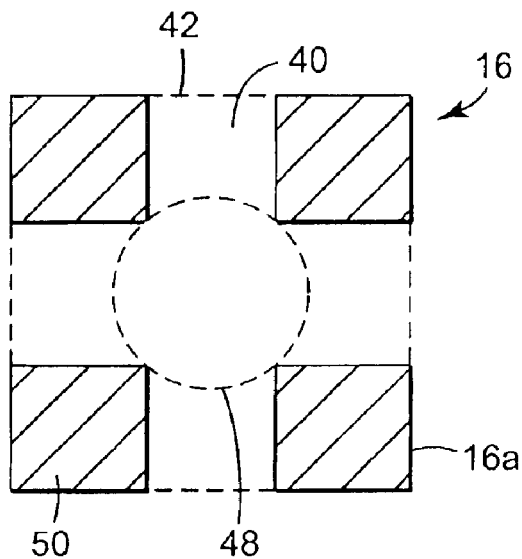
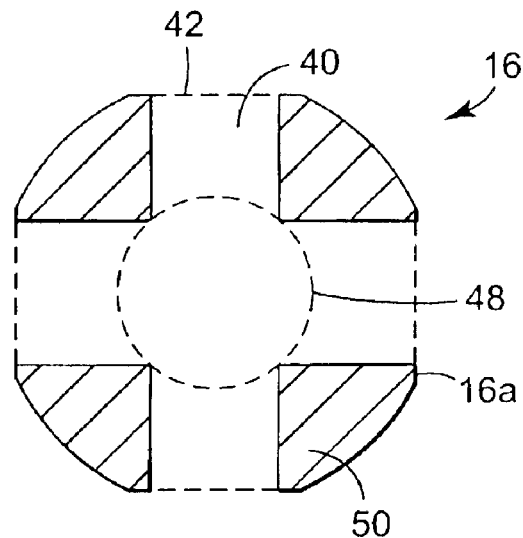
FIG. 4a    FIG. 4b
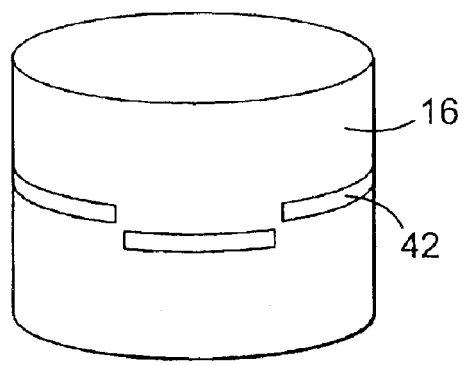
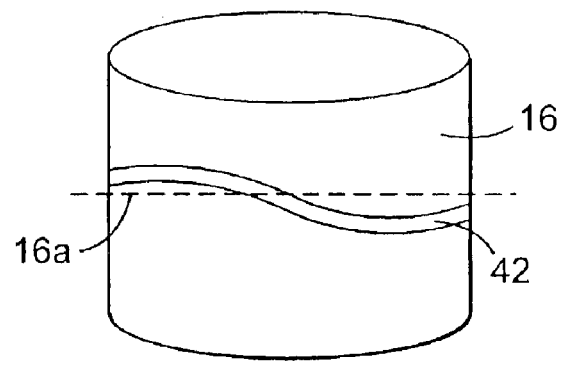
FIG. 5    FIG. 6

VALVE STEM FOR USE IN A METERING VALVE OF A METERED DOSE INHALER

RELATED APPLICATION DATA

This application claims priority to U.S. Provisional Patent Application Ser. No. 60/345,411, filed Dec. 31, 2001.

BACKGROUND

Metering valves are a common means by which aerosols are dispensed from aerosol containers. Metering valves are particularly useful for administering medicinal formulations that may include a liquefied gas propellant and are delivered to a patient in an aerosol.

When administering medicinal formulations, a dose of formulation sufficient to produce the desired physiological response is delivered to the patient. The proper, predetermined amount of the formulation must be dispensed to the patient in each successive dose. Thus, any dispensing system must be able to dispense doses of the medicinal formulation accurately and reliably to help assure the safety and efficacy of the treatment.

Metering valves have been developed to provide control over the dispensing of medicinal aerosol formulations. A metering valve regulates the volume of a medicinal formulation passing from a container to a metering chamber. A metering chamber typically is formed in a space between a structural portion of the metering valve such as a valve body and a moveable portion of the metering valve such as a valve stem. The metering chamber also may be defined, in part, by one or more fluid tight seals, each of which may be formed between, for example, an annular gasket and the valve stem. One such annular gasket may be a metering gasket that serves to isolate the metering chamber from a container holding the bulk formulation. Each seal generally is designed to remain fluid tight even when the valve stem slides past the gasket when the valve stem is actuated. A gasket and the valve stem generally are configured so that each conforms to the shape of the other, thereby facilitating the desired fluid tight seal. Depending upon the particular design of the metering valve, the metering chamber may be formed prior to or during actuation of the valve stem.

However, the valve stem may include additional surface features that may cause deterioration of the fluid tight seal between a gasket and the valve stem upon repeated actuation of the valve stem. For example, the valve stem may include an internal channel through which formulation flows in order to fill the metering chamber. The channel opening may have one or more sharp edges that can damage a metering gasket upon repeated actuation of the valve stem.

Damage to a gasket such as a metering gasket can degrade the seal between the gasket and the valve stem, thereby corrupting dose metering, contaminating the formulation with particles of gasket material, or both. Damage to a gasket also may block or partially block delivery of the formulation. This may occur directly, such as by accumulation of gasket fragments. Alternatively, the effect may be indirect; abraded gasket particles may act as "seeding" for precipitation or deposition of the formulation. Delivery of formulation may be completely or partially blocked by accumulated gasket particles, precipitated or deposited formulation, or both. Also, damage to a gasket may result in increased, unpredictable or uneven friction forces between the valve stem and the gasket. Such damage may require more force to actuate the metering valve to obtain a dose of formulation or otherwise adversely affect operation of the metering valve, resulting in inconsistent or improper dosing of formulation.

A related problem observed in some metering valves is that of seal intrusion, i.e., a gasket such as a metering gasket may intrude into an opening that exists in a portion of the metering valve. Even if the gasket sustains no substantial damage as a result of seal intrusion, performance of the metering valve may be compromised. For example, after a gasket intrudes into an opening, it subsequently must be removed from the opening in order to allow continued function of the metering valve, either continued actuation or a return to its resting position. Deforming the gasket sufficiently to remove the gasket from the opening may require substantial additional force. Such deforming of the gasket may be sufficient to render the gasket unable to reset the fluid tight seal with the valve stem, thereby compromising performance of the valve stem.

A gasket that intrudes into an opening may become lodged therein if it cannot be completely removed from the opening. This may lead to jamming of the metering valve and, therefore, partial or complete loss of performance. Seal intrusion also may require that an inconsistent, or even a consistent but higher, amount of force be applied in order to actuate the metering valve. Thus, metering valves susceptible to seal intrusion may be more difficult for a patient to use properly and, therefore, the patient may fail to obtain the prescribed dose of formulation.

Therefore, a need exists for a valve stem for use in an aerosol metering valve that is designed to limit the likelihood and extent of seal intrusion. A further need exists for a valve stem for use in an aerosol metering valve that is designed to limit damage to the metering gasket caused by seal intrusion, particularly upon repeated actuation of the metering valve.

SUMMARY

The present invention provides a valve stem for use in an aerosol metering valve that is designed to limit seal intrusion. As used herein, seal intrusion refers to intrusion of a gasket into an opening in any portion of the valve stem. Seal intrusion may compromise performance of the metering valve. Additionally, seal intrusion may cause damage to a metering gasket, particularly upon repeated actuation of the valve stem.

Certain valve stems are designed to permit the flow of formulation through one or more channels in the valve stem. Such channels may include short, broad channel openings. Intrusion of a gasket into a short, broad channel opening may be more likely than in connection with other channel opening designs, particularly if the channel opening is aligned along the same plane as the gasket. As the channel opening slides past the gasket during actuation of the valve stem, a portion of the gasket sealing surface may intrude into the channel opening. Such seal intrusion may compromise performance of the metering valve, as described above. Therefore, performance of the metering valve may be improved by providing at least one structure on the valve stem that is designed to limit the likelihood and extent of seal intrusion.

Any portion of the gasket that intrudes into the channel opening also may be susceptible to damage by an edge of the opening as the valve stem is further actuated, returned to the resting position, or both. Therefore, damage to the gasket may be reduced by providing structures on the valve stem that are designed to reduce the likelihood and extent of seal intrusion. Alternatively, the valve stem may include structures that are designed to assist the gasket in moving past an edge of the channel opening in a manner that limits damage to the gasket caused by seal intrusion.

Accordingly, the present invention provides a valve stem for use in an aerosol metering valve including a sealing gasket, the valve stem including: a stem portion comprising a discharge outlet, and a body portion comprising: i) a body wall that includes an exterior surface and an interior surface, the interior surface defining an interior space, ii) an inlet through the body wall in fluid communication with the interior space, iii) an outlet through the body wall in fluid communication with the interior space and including at least one opening, and iv) at least one gasket-protective component configured to limit seal intrusion. The gasket-protective component may include, for example, one or more rounded or beveled edges, at least one rib that at least partially traverses the opening, having a plurality of openings, a flattened or substantially planar area around the opening, or an arrangement in which the longitudinal position of at least a portion of at least one opening is different than the longitudinal position of at least one other portion of the opening, such as a wave or wave-like arrangement.

In another aspect, the present invention provides a method of reducing intrusion of a metering gasket into an opening in a valve stem, the method including the step of reconfiguring the valve stem to include at least one gasket-protective component.

BRIEF DESCRIPTION OF THE DRAWINGS

FIG. 4a is a transverse cross-sectional view of another alternative embodiment of an aerosol valve stem according to the present invention.

FIG. 4b is a transverse cross-sectional view of another alternative embodiment of an aerosol valve stem according to the present invention.

FIG. 5 is an isometric view of a portion of another alternative embodiment of an aerosol valve stem according to the present invention.

FIG. 6 is an isometric view of a portion of another alternative embodiment of an aerosol valve stem according to the present invention.

DETAILED DESCRIPTION OF ILLUSTRATIVE EMBODIMENTS OF THE INVENTION

The following description is set forth in terms of aerosol metering valves used to dispense an aerosol formulation from an aerosol container. However, the features of the present invention are equally applicable to any device in which a gasket is designed to occlude or seal an opening and in which the gasket may intrude into the opening. In particular, the metering valve designs described herein are useful for dispensing medicinal aerosol formulations.

Also, the present invention is described herein with respect to a single general metering valve design having a metering gasket that occludes a channel opening and a metering chamber that is formed upon actuation of the valve stem (a "transient metering chamber"). However, the features of the present invention are equally applicable to alternative metering valve designs in which a gasket of any type or for any function is designed to occlude or seal an opening and in which the gasket may intrude into the opening. Such alternative designs include other designs having a transient metering chamber as well as designs having a metering chamber that is at least partially formed prior to actuation of the valve stem.

The present invention is directed to valve stems such as those used in a metering valve. The valve stems of the present invention include at least one gasket-protective component designed to limit seal intrusion, i.e., intrusion of the gasket into an opening in a portion of the valve stem as it moves over the opening. As used herein, "gasket-protective component" refers to any design feature of the valve stem that may serve to limit seal intrusion. A gasket that has intruded into an opening may compromise performance of the metering valve by, for example, becoming lodged, requiring increased force to become dislodged, becoming deformed such that it cannot reset a fluid tight seal, or becoming damaged. Thus, valve stems that include a gasket-protective component may contribute to improved performance of the metering valve.

Gasket-protective components may include, but are not limited to, one or more rounded or beveled edges, at least one rib that at least partially traverses the opening, having a plurality of openings, a flattened or substantially planar area around the opening, or an arrangement in which the longitudinal position of at least a portion of at least one opening is different than the longitudinal position of at least one other portion of the opening, such as a wave or wave-like arrangement.

Figure 1:
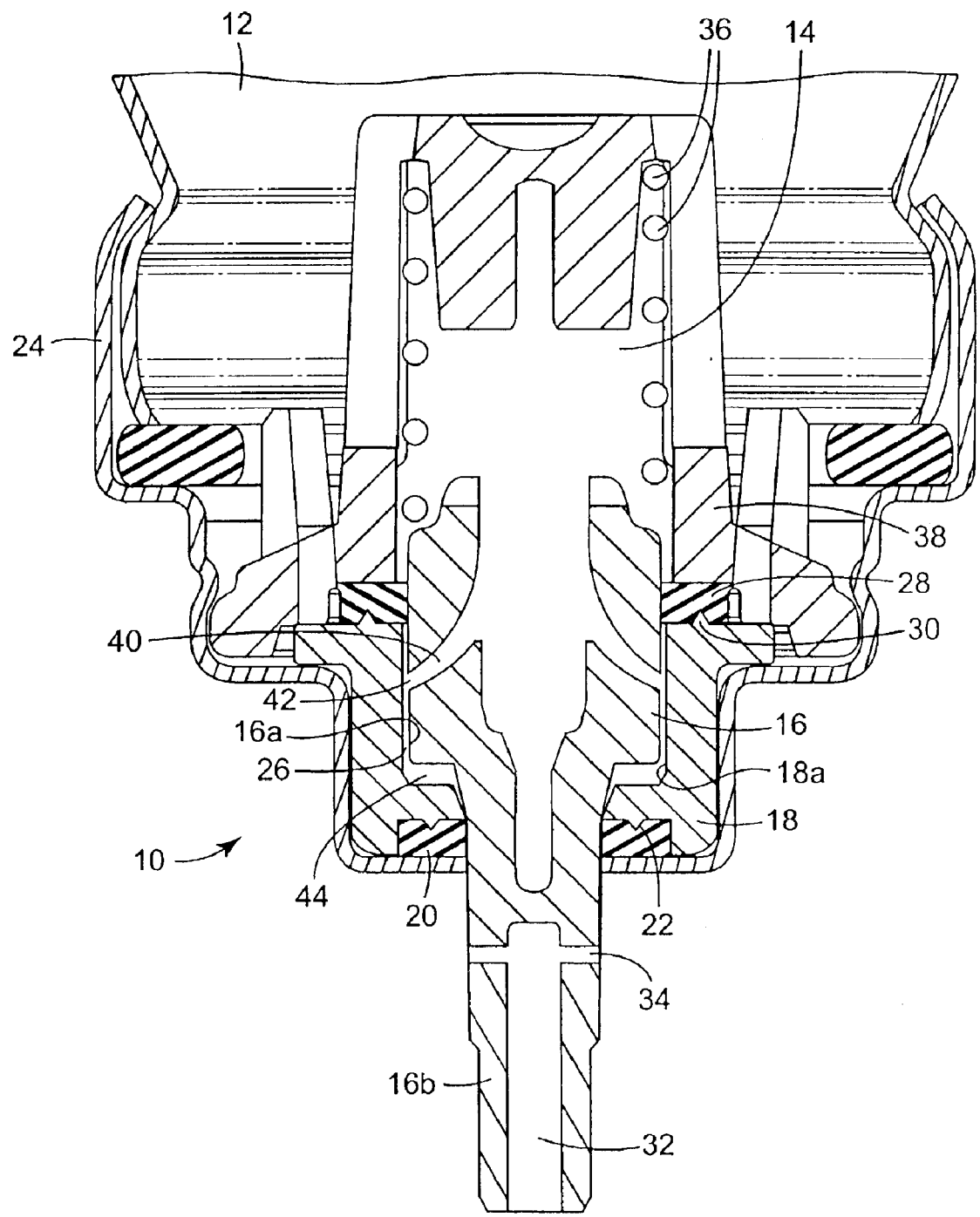
FIG. 1 is a cross-sectional view of an aerosol metering valve.

A metering valve 10 of a type that may include a valve stem according to the present invention is shown generally in FIG. 1. One end of the metering valve 10 is in fluid communication with a conventional aerosol container 12 (partially shown). Thus, aerosol formulation may be dispensed downwardly from the aerosol container 12 and through the metering valve 10 for delivery to a patient. Such delivery may be through a discharge piece (not shown) that may be designed to direct the aerosol formulation toward the body cavity or skin area to which the formulation is to be delivered. For example, the discharge piece may be a mouthpiece that can be inserted into the patient's mouth, thereby providing oral administration of the aerosol formulation for inhalation by the patient.

The metering valve 10 may include an interior chamber 14, a portion of which is occupied by the valve stem 16. One or more inlets may provide open and unrestricted fluid communication between the interior chamber 14 and the aerosol container 12.

The valve stem 16 generally includes a body portion including a side wall 16a. A stem portion of the valve stem 16b extends through an aperture in, and is in slidable, sealing contact with, a housing gasket 20. The stem portion of the valve stem 16b may include a discharge outlet 32 through which a metered dose of formulation may be discharged. The discharge outlet 32 may include one or more side holes 34.

The metering valve 10 may include a valve body 18 that includes a valve body wall 18a. The body portion of the valve stem 16 may be configured generally to have substantially the same shape as, but to be slightly smaller than, the valve body wall 18a that surrounds the valve stem body 16.

In the metering valve 10 shown in FIG. 1, an annular gap 26 is formed between the valve body wall 18a and the side wall of the valve stem 16a. When the valve stem 16 is actuated, the valve stem 16 is displaced into the interior chamber 14 of the metering valve 10 and a space is created between the valve stem 16 and the valve body 18, as shown in FIG. 1. The space thus created is the metering chamber 44. The valve stem 16 may fit concentrically inside the valve body 18 and provides sufficient clearance to allow formulation to flow between the valve stem 16 and the valve body 18 and into the metering chamber 44.

A spring 36 may be provided within the interior chamber 14 of the metering valve 10. The spring 36 serves to bias the valve stem 16 toward a resting position, i.e., the position assumed by the metering valve between uses. The spring 36 thus provides a means for returning the valve stem to the resting position after the stem is actuated and the dose of formulation is discharged. However, any suitable means for biasing the valve stem 16 to the resting position may be used.

The metering valve 10 shown in FIG. 1 also includes at least two annular gaskets, the metering gasket 28 and the housing gasket 20. The housing gasket 20 is positioned between a valve housing 24, the valve body 18 and the valve stem 16. The housing gasket 20 isolates the formulation in the aerosol container 12 from the exterior of the valve by forming two fluid tight seals: 1) an annular seal between the housing gasket 20 and the stem portion of the valve stem 16a, and 2) a compressive planar or face seal between the housing gasket 20 and the housing 24. The latter seal may be effected either with or without a sealing bead 22 on the valve body 18, the housing 24 or both.

The metering gasket 28 is positioned between the valve body 18, the spring cage 38, and the side wall of the valve stem 16a. The metering gasket 28 transiently isolates the formulation in the metering chamber 44 from the aerosol container 12 by forming two fluid tight seals: 1) an annular seal between the metering gasket 28 and the side wall of the valve stem 16a, and 2) a compressive planar or face seal between the metering gasket 28 and the valve body 18. The latter seal may be effected either with or without a sealing bead 30 on the valve body 18, the spring cage 38 or both. The metering gasket 28 provides a means for terminating the flow of formulation from the aerosol container 12 to the metering chamber 44 during actuation of the valve stem 16.

The metering valve 10 shown in FIG. 1 is operated by displacing the valve stem 16 inwardly into the interior chamber 14 against the compressive force of the spring 36. As the valve stem 16 is displaced inwardly, the metering chamber 44 is formed between the valve body 18 and the valve stem 16. The volume of the metering chamber 44 increases as the valve stem 16 is displaced. As the metering chamber 44 is formed, aerosol formulation flows from the aerosol container 12 to the metering chamber 44.

In the metering valve 10 shown in FIG. 1, formulation flows from the aerosol container 12 to the metering chamber 44 by passing through the valve stem 16 via one or more channels 40 having one or more channel openings 42. However, other metering valves may include valve stems that define alternative flow paths for the formulation to traverse as it flows from the aerosol container to the metering chamber. Such metering valves also may employ one or more gaskets that help regulate or control the movement of formulation through or past a valve stem to a metering chamber.

For the metering valve 10 shown in FIG. 1, aerosol formulation may enter the metering chamber 44 in the following manner. Formulation from the aerosol container 12 passes through one or more metering valve inlets and into the interior chamber 14 of the metering valve. From the interior chamber 14, the formulation passes through the one or more channels 40 in the valve stem 16, then through one or more channel openings 42 and the annular gap 26 and into the metering chamber 44.

Eventually, the valve stem 16 is displaced far enough into the interior chamber 14 so that the metering gasket 28 occludes the channel opening 42, thereby cutting off the flow path of formulation. The metering gasket 28 forms a fluid-tight seal around the valve stem 16 that prevents any additional flow of formulation to the metering chamber 44 and thereby terminates filling of the metering chamber 44.

As the metering gasket 28 occludes the channel opening 42 it also may intrude into the channel opening 42. A metering gasket 28 that has intruded into the channel opening 42 may compromise performance of the metering valve as described above, including becoming damaged by an edge of the channel opening 42 as the valve stem 16 is actuated further during normal operation. Repeated actuation of the valve stem 16 provides repeated opportunities for the metering gasket 28 to be damaged by the channel opening 42 in this way.

Further actuation of the valve stem allows the formulation in the metering chamber 44 to be discharged. As the valve stem 16 is fully actuated, the one or more side holes 34 of the discharge outlet 32 pass through the housing gasket 20 and come into fluid communication with the metering chamber 44. That fluid communication allows the aerosol formulation within the metering chamber 44 to be released into the one or more side holes 34 and the formulation thus passes through the discharge outlet 32, thereby delivering the metered dose of aerosol formulation to the patient or other desired area.

During the discharge of the aerosol formulation from the metering chamber 44, the metering gasket 28 continues to prevent the passage of additional bulk formulation from the aerosol container 12 to the metering chamber 44. After the dose of aerosol formulation is discharged, the patient releases the valve stem 16, which returns to its original resting position by the biasing action of the spring 36.

The foregoing description of the operation of a metering valve is provided as one example of a metering valve design that may benefit from the features of the present invention, described in detail below. However, other metering valve designs also may benefit from the features of the present invention. Any metering valve design having a gasket that occludes an opening may be susceptible to seal intrusion and one or more of the effects thereof. Thus, by employing the features of the present invention, such metering valve designs may experience reduced seal intrusion and, therefore, provide improved performance.

Figure 2:
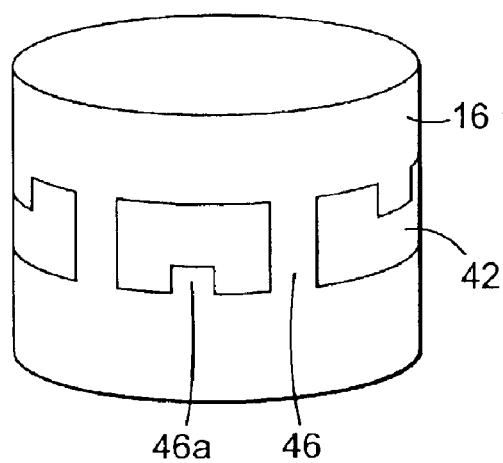
FIG. 2 is an isometric view of a portion of one embodiment of an aerosol valve stem according to the present invention.

FIG. 2 shows an isometric front view of a portion of one embodiment of the present invention. Multiple channel openings 42 are separated by ribs 46 of supporting material. The ribs 46 may span the entire height of the channel opening 42 and thereby provide structural support for the valve stem 16. The ribs 46 also may provide exclusionary support for a metering gasket as it moves past the channel opening 42, thereby limiting intrusion of the metering gasket into the channel opening 42.

Ribs 46 may be separated by any suitable circumferential distance, resulting in channel openings of any suitable width. Ribs circumferentially spaced relatively close to one another result in channel openings 42 having relatively small widths. Such a design reduces the geometric chord length of each channel opening 42, which may decrease the extent to which the metering gasket can intrude into the channel opening 42. Accordingly, damage to the metering gasket may be limited because less of the metering gasket may be in position to be damaged by an edge of the channel opening 42.

In some embodiments, certain ribs 46*a* may traverse only a portion of the channel opening 42. Such ribs may provide exclusionary support to the metering gasket while limiting the extent to which the ribs 46*a* occlude the surface area of the channel opening 42 available for the flow of formulation. Accordingly, seal intrusion may be limited. Furthermore, damage to the metering gasket may be limited because less of the metering gasket may be in position to be damaged by an edge of the channel opening 42. Also, the edges of the ribs 46*a* may be rounded or beveled so that they may further limit damage to the metering gasket.

The ribs 46*a* may be any suitable size or shape and may be positioned anywhere within the channel opening 42 that allows them to provide external support to the metering gasket. The ribs 46*a* may be distributed among channel openings and arranged, when present, in any suitable pattern. For example, FIG. 2 shows a valve stem 16 with a single rib 46*a* in each channel opening 42 and the ribs 46*a* extending from the top and bottom of adjacent channel openings 42 in an alternating pattern.

Alternatively, each channel opening 42 may have any desired number of ribs 46*a*. When a plurality of ribs 46*a* is present in a single channel opening 42, the ribs may be arranged in any desired pattern within the channel opening 42. Also, when ribs 46*a* are present in more than one channel opening 42, the ribs may be arranged in one channel opening in a pattern that is the same as in another channel opening, different from that in another channel opening, in alternating patterns between channel openings, and the like.

In certain embodiments, the valve stem according to the present invention may be used in a metering valve in connection with a gasket that may include one or more gasket-protective components of its own. Such gasket-protective components may include structures in addition to a sealing surface that may, during actuation of the metering valve, at least partially occlude a channel opening. Gaskets that include such gasket-protective components are described in U.S. Patent publication No. US 2003/0121935.

A metering valve that includes a gasket and a valve stem, each including at least one gasket-protective component, may be designed so that no matter how the valve stem and the gasket are rotationally aligned, the total cross-sectional area of the channel openings available for flow of formulation remains substantially similar. This may be so even though one or more gasket structures in addition to the sealing surface may at least partially occlude one or more channel openings. The metering valve may be designed so that, whatever the rotational alignment of the valve stem and the gasket, a substantially similar surface area of the channel openings is occluded by the one or more gasket-protective structures of the gasket.

Figure 3A:
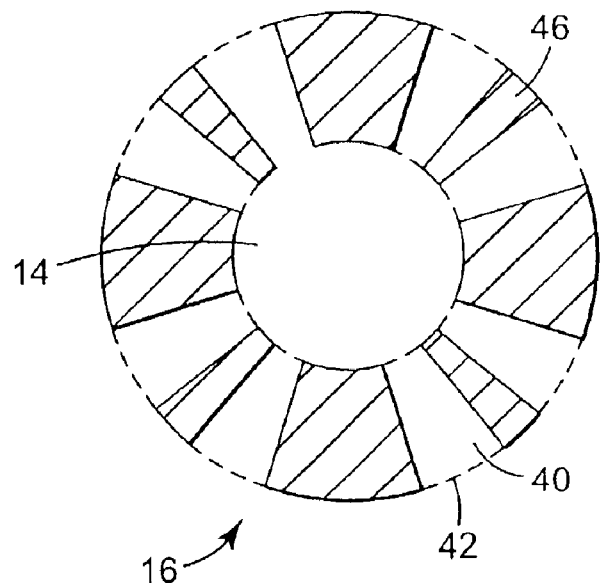
FIG. 3a is a transverse cross-sectional view of one embodiment of an aerosol valve stem according to the present invention.
Figure 3B:
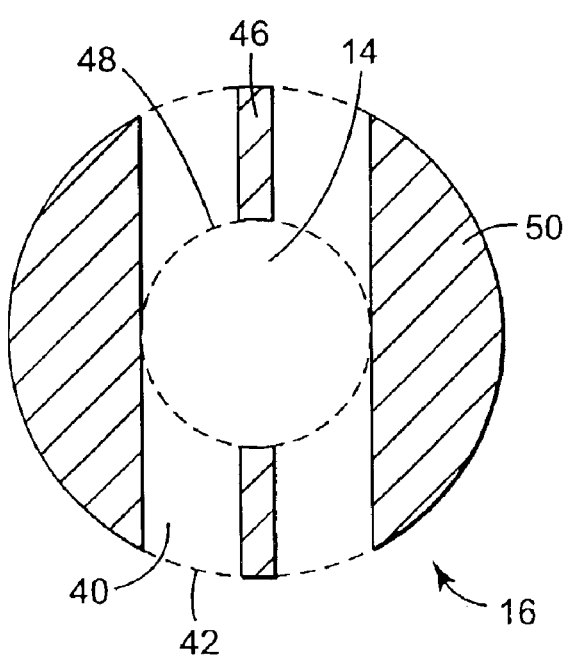
FIG. 3b is a transverse cross-sectional view of an alternative embodiment of an aerosol valve stem according to the present invention.

FIG. 3*a* and FIG. 3*b* show transverse cross-sections of alternative embodiments of the valve stem of the present invention. FIG. 3*a* shows a valve stem 16 in which a plurality of channels 40 and channel openings 42 are separated by a plurality of ribs 46 similar to the embodiment shown in FIG. 2. Each of the ribs 46 may be of substantially similar width or, alternatively, may be of varying widths. Likewise, the channels 40 and channel openings 42 may be of similar or dissimilar widths. FIG. 3*b* shows a valve stem 16 of the present invention in which the arrangement of the channels 40 is modified to increase the circumferential length of certain supporting pillars 50 while reducing obstruction of the flow of formulation across the inner stem circumference 48. Such a reduction in the extent to which flow of formulation is obstructed at the inner stem circumference 48 may improve the flow of formulation through the valve stem 16 and, in turn, improve the performance of the metering valve.

FIGS. 4*a* and 4*b* show transverse cross-sectional views of alternative embodiments of the present invention in which an area of the valve stem side wall 16*a* around the channel opening 42 is flattened. In the embodiment shown in FIG. 4*a*, the valve stem forms a polygon. The valve stem may form a square, but a polygon having any number of sides may be suitable for a particular application: The side wall of the valve stem 16*a* may be substantially planar. Thus, seal intrusion may be reduced in this embodiment because the design does not present an open chord across the channel opening 42.

The embodiment shown in FIG. 4*a* also includes polygonal pillars 50 as support structures. Any number of pillars 50 may be suitable for use in a valve stem 16 designed in accordance with the present invention. In one embodiment, one pillar 50 provides support at each corner of the polygon defined by the valve stem 16. The pillars 50 may have any number of sides. However, square pillars 50, as shown in FIG. 4*a*, help provide a planar outer surface of the valve stem 16*a* and do not intrude into the inner stem circumference 48, thereby reducing seal intrusion and limiting adverse effects on flow performance.

Additionally, the pillars 50 may or may not be the same polygonal shape as the valve stem 16. Pillars 50 that provide a substantially planar channel opening 42 may be particularly useful for limiting intrusion of the metering gasket into the channel opening 42 and, therefore, particularly useful for limiting damage to the metering gasket, regardless of the specific shape of each individual pillar 50. Also, the valve stem 16 and the pillars 50 need not be regular polygons, as shown in FIG. 4*b*, although a design including regular polygons may provide manufacturing advantages.

FIG. 5 shows an isometric view of the body portion of a valve stem illustrating another alternative embodiment of the present invention. In this embodiment, the channel openings 42 are offset along the longitudinal axis of the valve stem 16. Consequently, each individual channel opening 42 may have a relatively short chord length, thereby limiting seal intrusion and, therefore, also limiting damage to the metering gasket that results from seal intrusion. Moreover, the offset arrangement of the channel openings 42 allows for more complete use of the entire circumference of the valve stem 16 for providing the total surface area of the channel openings 42. The ends of adjacent but offset channel openings 42 may be closer together and still provide adequate external support for the metering gasket than the ends of adjacent and aligned channel openings 42 separated by ribs.

FIG. 6 shows an isometric view of the body portion of a valve stem 16 illustrating another alternative embodiment of the present invention. This embodiment provides a continuous and circumferential channel opening 42 in the form of a sinusoidal wave. Thus, for any point on the valve stem body wall, the position of the channel opening 42 along the longitudinal axis of the valve stem body wall depends sinusoidally on the radial location of the point. In order to maintain the channel opening 42, one or more internal supports (not shown) may connect the portions of the valve stem body 16 above and below such a continuous circumferential channel opening 42.

The channel opening 42 may be designed so that the amplitude of the sinusoidal wave is greater than the height of the channel opening 42. Thus, despite the continuous nature of the channel opening 42, at least a portion of the side wall of the valve stem 16a provides exclusionary support to the metering gasket at any transverse section of the valve stem 16a. Thus, the metering gasket receives exclusionary support throughout the entire length of actuation, thereby limiting seal intrusion and, therefore, also limiting damage to the metering gasket that results from seal intrusion. At the same time, the continuous channel opening 42 provides maximum channel opening surface area for conducting flow of formulation.

In some alternative embodiments, the sinusoidal channel opening may be combined with one or more ribs in order to provide additional structural support for the valve stem and additional exclusionary support for the metering gasket. In some embodiments, the ribs may completely traverse the channel opening, thereby creating a plurality of partial-wave openings rather than a continuous sinusoidal wave.

In yet another alternative embodiment, at least a portion of at least one channel opening may include a wave or be wave-like without necessarily defining a sinusoidal wave or a portion of a sinusoidal wave. As used herein, a "wave" or "wave-like" channel opening shall refer to a channel opening in which at least a first portion of the channel opening has a different longitudinal position on the surface of the valve stem than at least a second portion of the channel opening, regardless of whether the transition from the first portion to the second portion of the channel opening is curved, smooth, angled, etc. Such embodiments may include a single channel opening that may or may not be continuous around the circumference of the valve stem. Alternatively, such embodiments may include a plurality of channel openings. In such embodiments, at least a portion of the side wall of the valve stem provides exclusionary support to the metering gasket at any transverse section of the valve stem. Thus, the metering gasket receives exclusionary support throughout the entire length of actuation, thereby limiting intrusion and, therefore, also limiting damage to the metering gasket that results from seal intrusion.

Each of the embodiments described herein may be used alone or in combination with one or more additional embodiments in order to reduce the likelihood of seal intrusion and, therefore, also limit damage to the metering gasket that results from seal intrusion to a degree suitable for a desired use.

Also, each of the embodiments described herein may be used in combination with one or more gasket-protective structures located on a portion of the metering valve, e.g., the valve stem, to further limit the likelihood and extent of seal intrusion.

The complete disclosures of the patents, patent documents, and publications cited herein are incorporated by reference in their entirety as if each were individually incorporated. In case of conflict, the present specification shall control.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A valve stem for use in an aerosol metering valve comprising a sealing gasket, the valve stem comprising:
    a stem portion comprising a discharge outlet, and
    a body portion comprising:
        i) a body wall that comprises an exterior surface and an interior surface, the interior surface defining an interior space,
        ii) an inlet through the body wall in fluid communication with the interior space and comprising at least one opening,
        iii) an outlet through the body wall in fluid communication with the interior space and comprising at least one opening,
        iv) a longitudinal axis defining a longitudinal position of a structure along the valve stem, and
        v) at least one gasket-protective component configured to limit seal intrusion wherein at least a portion of an inlet opening or at least a portion of an outlet opening is constructed so that its longitudinal position on the body wall is different than at least one other portion of the opening.

2. The valve stem of claim 1 wherein the gasket-protective component comprises at least one rounded or beveled edge of the at least one outlet opening.

3. The valve stem of claim 2 wherein the gasket-protective component comprises at least one rib that is substantially continuous with the exterior surface of the body wall and at least partially traverses the outlet opening.

4. The valve stern of claim 3 wherein the rib completely traverses the outlet opening.

5. The valve stem of claim 1 wherein the longitudinal position of a portion of the inlet opening outlet opening depends sinusoidally on its radial position around the body wall.

6. The valve stem of claim 5 wherein the inlet opening or outlet opening comprises at least one rib that is substantially continuous with the exterior surface of the body wall and at least partially traverses the outlet opening.

7. The valve stem of claim 6 wherein the rib completely traverses the inlet opening or outlet opening.

8. A valve stem for use in an aerosol metering valve comprising a sealing gasket, the valve stem comprising:
    a stem portion comprising a discharge outlet, and
    a body portion comprising:
        i) a body wall that comprises an exterior surface and an interior surface, the interior surface defining an interior space,
        ii) an inlet through the body wall in fluid communication with the interior space and comprising at least one opening,
        iii) an outlet through the body wall in fluid communication with the interior space and comprising at least one opening,
        iv) a longitudinal axis defining a longitudinal position of a structure along the valve stem, and
        v) at least one gasket-protective component configured to limit seal intrusion, wherein the gasket-protective component comprises at least one gasket supportive rib that separates two inlet openings or two outlet openings, and comprises a portion of the exterior surface of the body wall.

9. The valve stem of claim 8 wherein the gasket-protective component comprises at least a portion of the exterior surface of the body wall around at least one outlet opening that is substantially planar.

10. The valve stem of claim 9 wherein a transverse cross-section of the body portion of the valve stem forms a square.

11. The valve stem of claim 8 wherein at least two inlet openings or two outlet openings are offset along the longitudinal axis.

* * * * *

UNITED STATES PATENT AND TRADEMARK OFFICE
CERTIFICATE OF CORRECTION

PATENT NO. : 6,863,195 B2  Page 1 of 1
DATED : March 18, 2005
INVENTOR(S) : Bryant, Andrew M.

It is certified that error appears in the above-identified patent and that said Letters Patent is hereby corrected as shown below:

<u>Column 10,</u>
Line 33, delete the word "stern" and insert in place thereof -- stem --.
Line 36, after "inlet opening" insert -- or --.

Signed and Sealed this

Thirty-first Day of May, 2005

JON W. DUDAS
*Director of the United States Patent and Trademark Office*